United States Patent
Weigel et al.

[11] Patent Number: 6,008,605
[45] Date of Patent: Dec. 28, 1999

[54] METHOD FOR DETERMINING THE ACTIVE POWER OF ASYNCHRONOUS ELECTRIC MOTORS

[75] Inventors: Wilfried Weigel, Werne; Arno Breimhorst, Hagen; Jens Titschert, Lünen; Martin Eickhoff, Dortmund, all of Germany

[73] Assignee: DBT Deutsche Bergbau-Technik GmbH, Germany

[21] Appl. No.: 09/159,850

[22] Filed: Sep. 24, 1998

[51] Int. Cl.$^6$ ........................................ H02P 1/04
[52] U.S. Cl. .................... 318/430; 318/432; 318/434; 318/625; 318/798; 318/461; 318/463; 318/569
[58] Field of Search ..................... 318/430, 432, 318/434, 625, 798, 461, 463, 569

[56] References Cited

U.S. PATENT DOCUMENTS

| | | | |
|---|---|---|---|
| 4,091,294 | 5/1978 | Zankl et al. | 318/430 |
| 4,157,658 | 6/1979 | Grice . | |
| 4,204,425 | 5/1980 | Mallick, Jr. | 318/430 |
| 4,320,662 | 3/1982 | Schaub et al. | 318/430 |
| 4,490,094 | 12/1984 | Gibbs | 318/430 |
| 5,421,302 | 6/1995 | Livshits et al. | 318/430 |
| 5,747,960 | 5/1998 | Quaggio | 318/625 |

FOREIGN PATENT DOCUMENTS

| | | |
|---|---|---|
| 2 032 624 | 5/1980 | United Kingdom . |
| 2 107 878 | 5/1983 | United Kingdom . |
| 2 237 111 | 4/1991 | United Kingdom . |
| 2 262 345 | 6/1993 | United Kingdom . |

*Primary Examiner*—Karen Masih
*Attorney, Agent, or Firm*—Vickers, Daniels & Young

[57] ABSTRACT

A method for determining the active power (P) of asynchronous electric motors of winning and conveying equipment in underground mining. According to the invention, particularly easy and accurate determination of the instantaneous active power of the motors is obtained by storing the individual motor characteristic (P(n); M(n)) of each motor in a computer, by detecting the instantaneous speed (n, n') of the motor with the aid of a tachometer and by comparing this speed with the characteristic stored in the computer, the active power being derived from the torque value or power value assigned to the detected instantaneous speed, as stored in the computer. This particularly rapid and simple calculation of the power value does not require any readings to be taken at the power supply to the motors.

14 Claims, 2 Drawing Sheets

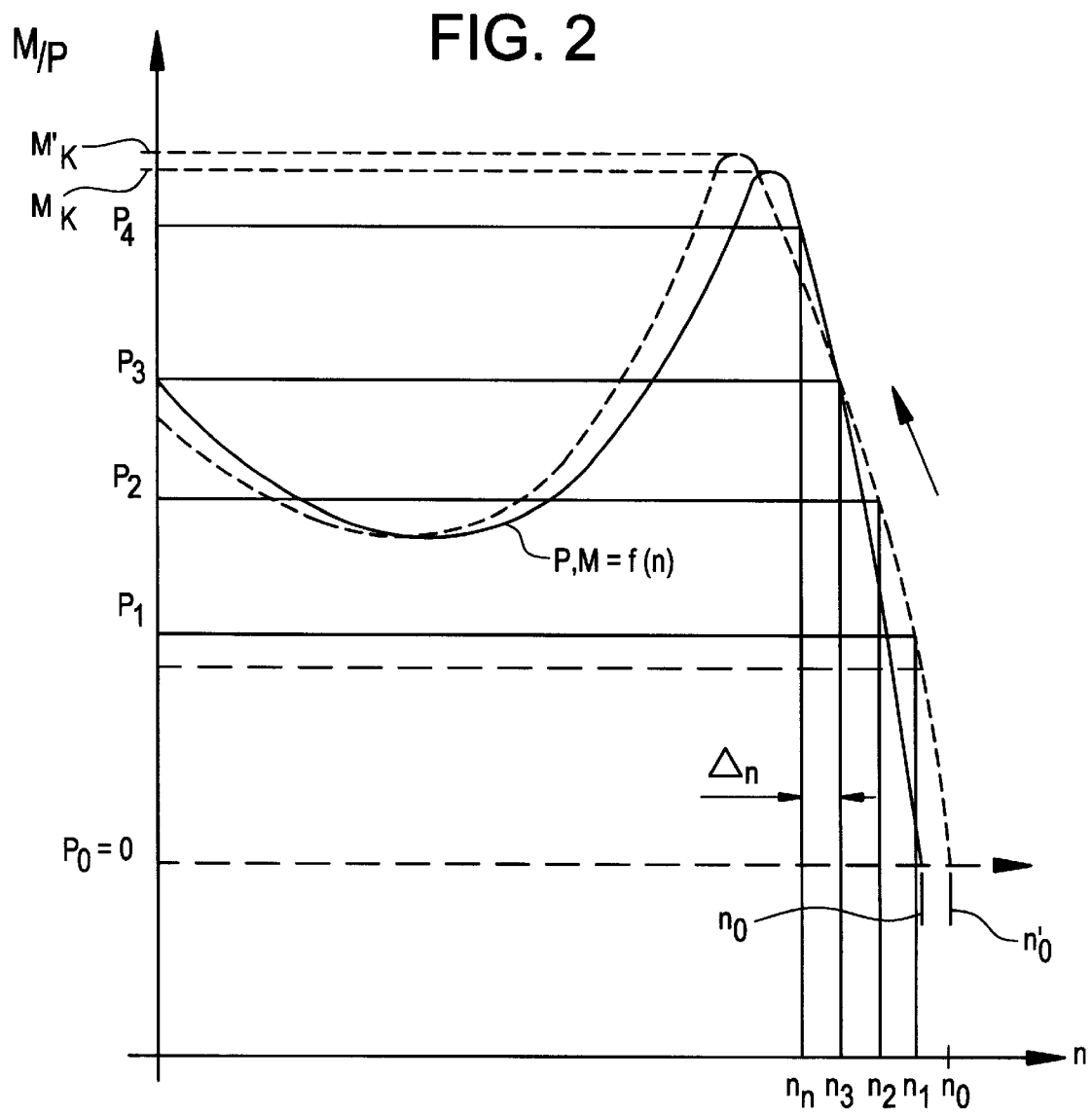

METHOD FOR DETERMINING THE ACTIVE POWER OF ASYNCHRONOUS ELECTRIC MOTORS

FIELD OF THE INVENTION

The invention relates to a method for determining the active power of asynchronous electric motors, particularly, although not necessarily exclusively, those used to drive winning and conveying equipment in underground mining.

BACKGROUND TO THE INVENTION

Asynchronous electric motors, which are regarded as particularly robust, and can be obtained with high power ratings, are commonly used for driving heavy machinery, e.g. scraper chain conveyors, coal ploughs and shearer loaders used in mines. Especially where several motors are harnessed together to drive one machine, it is necessary to determine the power output of the individual motors, in order that the various drives can be harmonized so that the load handled by the driven machine is evenly taken up by the various drive motors. Since the loading of the machines, and hence of the motors which drive them, is continually changing, rapid determination of the power output of the individual motors, giving the possibility of rapid adjustment, is desirable.

Hitherto the usual way of determining the power of asynchronous motors has been to measure the voltage supplied to them, and the active current. The active power is then obtained in a known manner by multiplying the voltage by the active current. For many power supply systems, especially underground systems, this known method is difficult and imprecise. It involves taking readings directly at the current supply to the motors, which is very costly, particularly where a large number of motors have to be monitored.

SUMMARY OF THE INVENTION

It is a general aim of the invention to provide a method for determining the active power of asynchronous electric motors which will allow the power to be determined very accurately and easily, and the motor to be regulated very rapidly. Accordingly the invention proposes storing the individual torque/speed characteristic of each motor in a computer memory, detecting the instantaneous speed of the motor with the aid of a tachometer (separately in terms of electrical potential from the mains supply to the motor), and comparing the instantaneous speed of the motor with the speed values stored in the computer, the active power then being derived from the stored torque value assigned to the detected instantaneous speed value.

Since the torque and power of an asynchronous motor are proportional to one another, a possible alternative method is to store in the computer the power/speed characteristic of the individual motor, to detect the instantaneous speed of the motor with the aid of a tachometer and to compare the instantaneous speed with the speed values stored in the computer, the instantaneous active power then being equal to the stored power value assigned to the detected instantaneous speed value.

The invention makes use of the knowledge that every asynchronous motor possesses an individual speed/torque or speed/power characteristic that does not vary, even when the motor has been in service for a long time. This characteristic needs to be determined only once, and usually will have already been determined by the motor manufacturer during test runs prior to delivery. The characteristic thus determined can be stored in a normal process computer, so that the instantaneous power (or instantaneous torque) of the motor can be determined with certainty, and very rapidly, as a function of the instantaneous speed detected by the tachometer and transmitted to the process computer.

The invention has the particular advantage that the power can be determined without having to intrude upon the power supply to the motor; such intrusion in itself could have an unquantifiable effect on the motor's power. The power values determined by the method according to the invention can be stored in the process computer and can also be transmitted via suitable data links to a higher-ranking master computer. The data can readily be used for detecting motor overload, in which case the process computer itself can conveniently attend to the switching-off of the overloaded motor.

In a preferred configuration of the invention, the new method can be used for detecting the speeds of several motors harnessed to the same winning or conveying equipment, and for determining from these speeds the instantaneous power values of the individual motors; and the load can be balanced among the motors in response to the instantaneous power values thus determined. This balancing of the load may be effected in a manner known in itself by means of at least one induction coupling or back-up motor, or by changing the frequency of the mains supply to the motor concerned. Whichever regulating apparatus is employed, it may be controlled by the computer to make the speed correction necessary for balancing the load.

The motor characteristics stored in the computer memory may be stored in the form of tables, a value denoting active power (or, as the case may be, torque) being assigned to every speed value. This "digital" form of representation of the motor characteristics may require a relatively large amount of storage space, if the range of speed between zero and the nominal speed of the motor is divided into a very large number of increments; but as storage capacity in today's computers is large, this drawback is definitely offset by the particularly rapid intervention which becomes possible, with power values made available practically in real time. Of course, every motor characteristic stored in the computer may additionally or alternatively be stored in "analogue" form as a functional equation, in which case the power to be determined has to be calculated as a function of the instantaneous speed reading.

Further preferred features and advantages of the invention will be apparent from the following description and drawings, in which a preferred embodiment of the invention is described in detail by way of example.

BRIEF DESCRIPTION OF THE DRAWINGS

FIG. 2 shows the characteristics of two asynchronous electric motors.

DETAILED DESCRIPTION OF AN EMBODIMENT

Figure 1:
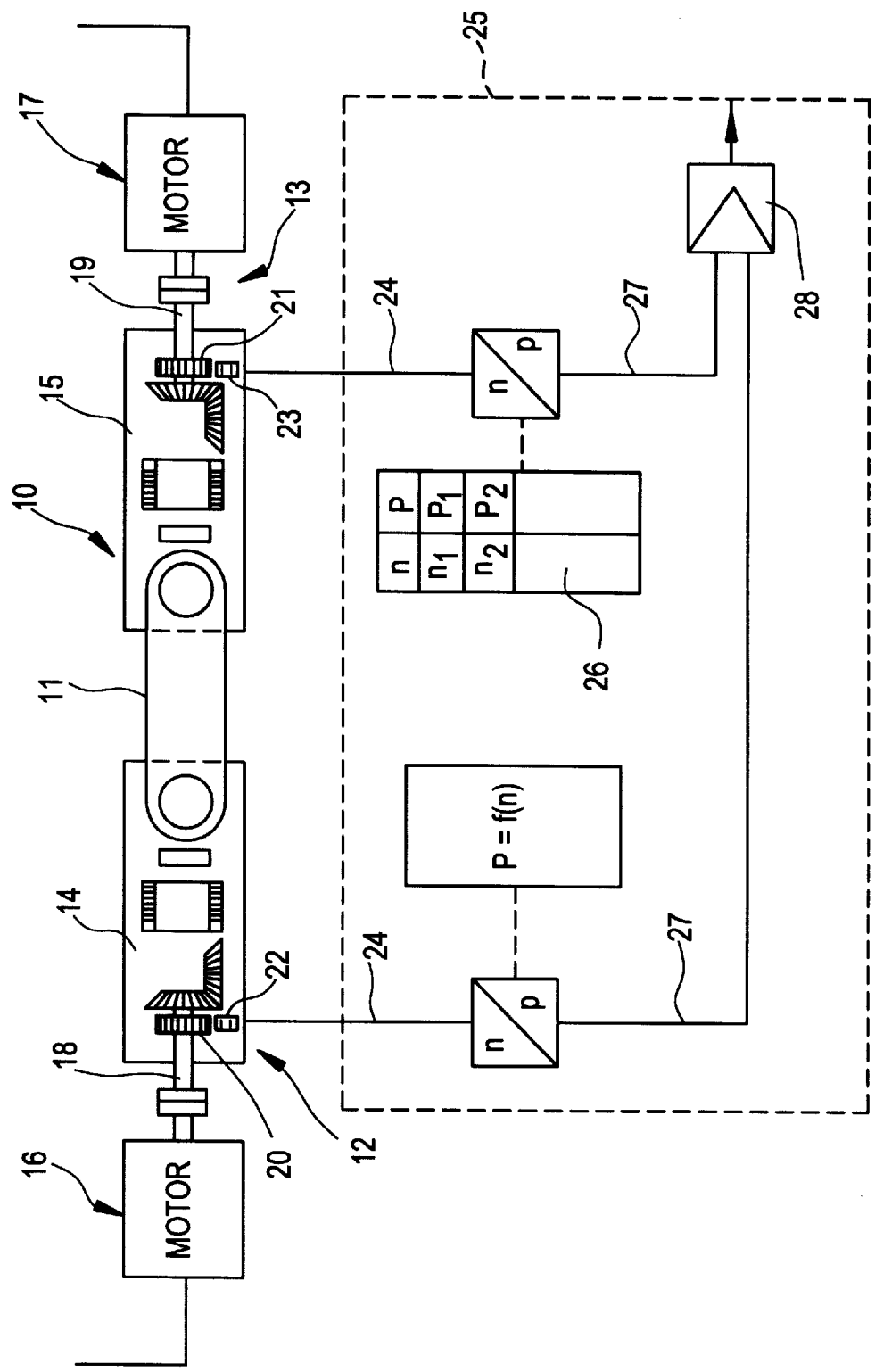
FIG. 1 shows schematically a conveyor installation in an underground mining application, with an apparatus for carrying out the method according to the invention.

In FIG. 1, 10 denotes a conveyor installation for underground mining, in this example a scraper chain conveyor with an endless conveyor chain 11 which is driven by a main drive 12 and an auxiliary drive 13. The main drive 12 and the auxiliary drive 13 each possess a gear mechanism 14,15, to the input end of which a first asynchronous electric motor 16 for the main drive, and a second asynchronous motor 17 for the auxiliary drive 13, are flange-connected.

Tachometer discs 20,21 are mounted on driven shafts 18,19, of the motors 16,17, and are scanned as they rotate by sensors 22, 23. Each combination of a disc 20,21 and its respective sensor 22,23 forms a tachometer for detecting the instantaneous speed of the respective motor 16,17.

The detected speeds n and n' of the main and auxiliary drive motors, respectively, are fed via data lines 24 to a computer 25 in which the instantaneous active power of the two motors 16, 17 is determined. Stored in the computer for this purpose are the motor characteristics of both asynchronous motors 16, 17; these characteristics are shown in FIG. 2.

As can be seen from FIG. 2, the characteristics of the motor 16 for the main drive 12 and of the motor 17 for the auxiliary drive 13 follow curves which are similar though not identical. The two motors differ in their no-load speed $n_0$ and $n'_0$, in their pull-out torque $M_K$ and $M'_K$, and in the gradients of their individual operational ranges. The motor characteristics $M/P=f(n)$ and $M'/P'=f(n')$ of different asynchronous motors of the same rated power $P_N$ are individually different, but do not vary in the course of their operating life. The motor characteristics once determined, for example in the course of a test run, for the main drive and the auxiliary drive are entered permanently in the computer 25, either in analogue form—as shown for the main drive in FIG. 1—with the graph drawn as an unbroken line in FIG. 2 represented in the form the functional equation $P=f(n)$, or in the form of a table—as shown for the auxiliary drive in FIG. 1—in which the range of the characteristic between a speed of zero and the no-load speed $n'_0$ is subdivided into the largest possible number of increments $\Delta n$, and power values $P_1, P_2, P_3$ etc. are respectively assigned to each speed value $n_1, n_2, n_3$ etc. thus defined.

Using the arrangement described, the instantaneous active power of the motors 16,17 can be determined very rapidly and accurately either by comparing in the computer the instantaneous speeds scanned by the sensors 22, 23 with the speed values $n_1$ to $n_n$ stored in the table 26 and then outputting the corresponding power value P' (as illustrated for the auxiliary drive), or by calculating, and then outputting, the power from the equation $P=f(n)$ (as illustrated for the main drive). With either method of determining the instantaneous power value of the motors, (digital or analogue) an output is made to the output lines 27 practically in real time, so that corrections necessary for balancing the load between the drives 12,13 can be calculated without delay in an evaluation and/or regulating unit 28 and passed to a load-balancing apparatus (not shown), such as a back-up motor, an induction coupling or a frequency converter, for one of the drives.

The invention is not limited to the embodiment which has been specifically illustrated and described, and a large number of adaptations and modifications are possible without departure from the spirit and scope of the invention. For example, since the torque (M) and power (P) of asynchronous motors are proportional to one other, being related by the equation $P=2\pi nM$, it is of course possible to enter torque values in the table 26, rather than power values, from which the computer 25 can calculate the instantaneous power value by applying the above equation. The same applies to the representation of the motor characteristic in analogue form $M=f(n)$. The instantaneous power values obtained by the computer may be stored in the computer itself for later review; and they may also be transmitted to a remote master computer for monitoring purposes. The method according to the invention can be used to particular advantage for detecting overload of the motor or motors being monitored, which can be stopped almost immediately if a predetermined maximum torque or maximum power is exceeded. The method also lends itself to a particularly easy load-controlled start-up of the conveyor installation 10 or other machines and equipment, especially in underground mining.

We claim:

1. A method for determining the active power of at least one asynchronous electric motor said at least one motor having a torque-rotational speed characteristic, the method comprising the steps of:

providing a computer, storing on said computer said torque-rotational speed characteristic of said at least one motor;

providing a tachometer, detecting an instantaneous rotational speed of said at least one motor, said speed being detected with the aid of said tachometer, comparing said torque-rotational speed characteristic to said detected instantaneous rotational speed, deriving a torque value corresponding to said detected speed, and determining said active power from said derived torque value.

2. A method according to claim 1 for determining the active powers of a plurality of asynchronous motors harnessed to a common item of winning or conveying equipment, including detecting the speeds of the plurality of motors determining the instantaneous power values of the individual motors from said speeds, and balancing a load between the motors in dependence on the instantaneous power values determined.

3. A method according to claim 2, including providing an induction coupling and regulating said load balancing with said induction coupling.

4. A method according to claim 2, including providing at least one back-up motor and balancing the load on said plurality of motors by activating said at least one back-up motor.

5. A method according to claim 2, including balancing the load on said plurality of motors by changing the frequency of the main supply to each of said plurality of motors.

6. A method according to claim 1, including storing said at least one motor characteristic in the computer in the form of a table and assigning torque values to respective ones of a series of speed values.

7. A method according to claim 1, including storing said at least one motor characteristic in the computer in the form of a functional equation and calculating the active power as a function of the detected speed.

8. A method for determining the active power of at least one asynchronous electric motor said at least one motor having a power-rotational speed characteristic, the method comprising the steps of:

providing a computer, storing on said computer said power-rotational speed characteristic of said at least one motor;

providing a tachometer, detecting an instantaneous rotational speed of said at least one motor, said speed being detected with the aid of said tachometer, and comparing said power-rotational speed stored characteristic to said instantaneous rotational speed and determining said active power from said detected speed.

9. A method according to claim 8 for determining the active powers of a plurality of asynchronous motors harnessed to a common item of winning or conveying equipment, including detecting the speeds of the plurality of motors determining the instantaneous power values of the individual motors from said speeds, and balancing a load between the motors in dependence on the instantaneous power values determined.

10. A method according to claim 9, including providing an induction coupling and regulating said load balancing with said induction coupling.

11. A method according to claim 9, including providing at least one back-up motor and balancing the load on said plurality of motors by activating said at least one back-up motor.

12. A method according to claim 9, including balancing the load on said plurality of motors by changing the frequency of the main supply to each of said plurality of motors.

13. A method according to claim 8, including storing said at least one motor characteristic in the computer in the form of a table and assigning torque values to respective ones of a series of speed values.

14. A method according to claim 8, including storing said at least one motor characteristic in the computer in the form of a functional equation and calculating the active power as a function of the detected speed.

* * * * *